(12) United States Patent
Campbell

(10) Patent No.: US 11,539,108 B1
(45) Date of Patent: Dec. 27, 2022

(54) RECONFIGURABLE QUADRATURE COUPLER

(71) Applicant: Qorvo US, Inc., Greensboro, NC (US)

(72) Inventor: Charles Forrest Campbell, Dallas, TX (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 17/365,631

(22) Filed: Jul. 1, 2021

(51) Int. Cl.
*H01P 5/18* (2006.01)
*H01P 5/16* (2006.01)
*H03K 5/1252* (2006.01)

(52) U.S. Cl.
CPC .............. *H01P 5/16* (2013.01); *H01P 5/186* (2013.01); *H03K 5/1252* (2013.01)

(58) Field of Classification Search
CPC .. H01P 5/16; H01P 5/186; H01P 5/185; H01P 5/184; H03K 5/1252
See application file for complete search history.

(56) References Cited

U.S. PATENT DOCUMENTS

| | | | | |
|---|---|---|---|---|
| 5,428,320 A | * | 6/1995 | Lindberg | ............ H04L 27/2039 375/282 |
| 7,570,932 B1 | | 8/2009 | Folkmann | |
| 2007/0008132 A1 | | 1/2007 | Bellatoni | |

OTHER PUBLICATIONS

Lehmann et al. "Reconfigurable PA Networks using Switchable Directional Couplers as RF Switch" Proceedings of the 37th European Microwave Conference, IEEE, Oct. 2007, Munich Germany, pp. 1054-1057.
U.S. Appl. No. 17/365,672, filed Jul. 1, 2021.

* cited by examiner

*Primary Examiner* — Jung Kim
(74) *Attorney, Agent, or Firm* — Withrow & Terranova, P.L.L.C.

(57) ABSTRACT

A reconfigurable quadrature coupler is disclosed. The reconfigurable quadrature coupler includes an input port transmission line connected to a first port, a coupled port transmission line and a coupled port transformer connected between the coupled port transmission line and a second port. The coupled port transformer is configured to have a selectable second port reflection coefficient. The reconfigurable quadrature coupler further includes an isolation port transmission line and an isolation port transformer connected between the isolation transmission line and a third port. The isolation port transformer is configured to have a selectable third port reflection coefficient. Also included is a through port transmission line and a through port transformer connected between the through port transmission line and a fourth port. The through port transformer is configured to have a selectable fourth port reflection coefficient.

20 Claims, 7 Drawing Sheets

RECONFIGURABLE QUADRATURE COUPLER

RELATED APPLICATIONS

This application is related to U.S. patent application Ser. No. 17/365,672, filed Jul. 1, 2021, the disclosure of which is hereby incorporated herein by reference in its entirety.

FIELD OF THE DISCLOSURE

The present disclosure relates to quadrature couplers and in particular to Lange couplers utilized in combination with radio frequency amplifiers.

BACKGROUND

Quadrature couplers are used in radio frequency circuitry to split input power between coupled and through ports. The quadrature couplers split input power between the coupled and through ports with a 90-degree phase shift. Traditional quadrature couplers have fixed modes of operation. At present, there are reports of couplers that are two-mode reconfigurable couplers. The two modes are a quadrature mode and a so-called "bypass" mode that couples a first quadrature port to a second quadrature port. However, a third mode, referred to herein as a through mode, in which power flows directly from the first quadrature port to the second quadrature port is not available with these types of reconfigurable couplers. Thus, a new reconfigurable quadrature coupler having this third mode of operation is desirable.

SUMMARY

A reconfigurable quadrature coupler is disclosed. The reconfigurable quadrature coupler includes an input port transmission line connected to a first port, a coupled port transmission line and a coupled port transformer connected between the coupled port transmission line and a second port. The coupled port transformer is configured to have a selectable second port reflection coefficient.

The reconfigurable quadrature coupler further includes an isolation port transmission line and an isolation port transformer connected between the isolation transmission line and a third port. The isolation port transformer is configured to have a selectable third port reflection coefficient. Also included is a through port transmission line and a through port transformer connected between the through port transmission line and a fourth port. The through port transformer is configured to have a selectable fourth port reflection coefficient.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figures 1A, 1B:
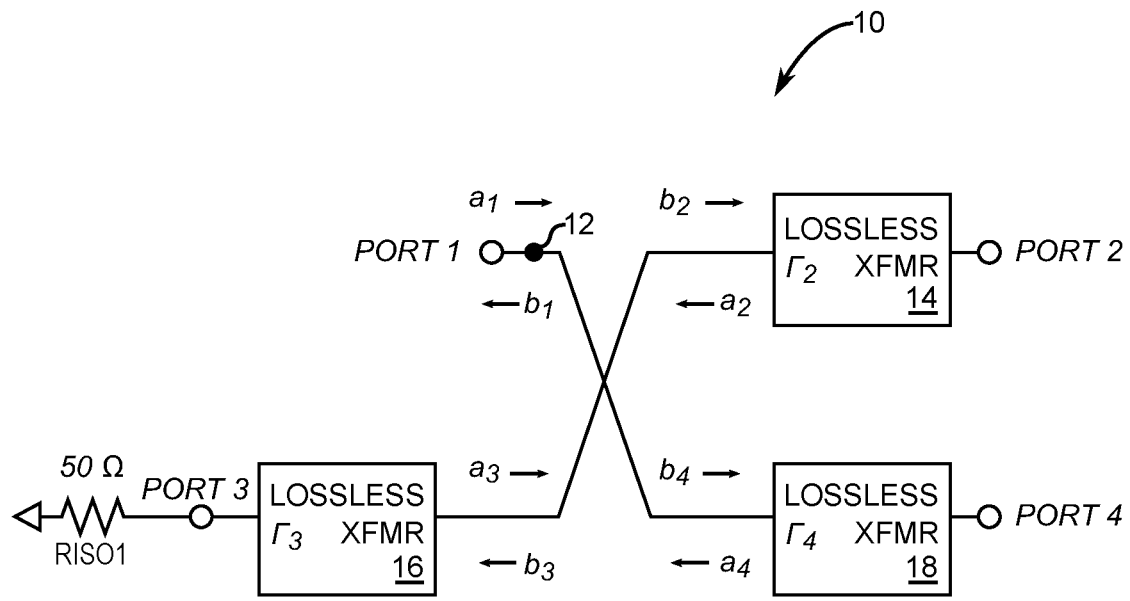
FIG. 1A is a simplified diagram of a three-mode reconfigurable quadrature coupler that is structured in accordance with the present disclosure.
FIG. 1B depicts an ideal scattering matrix for a Lange coupler.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Three-Mode Coupler Theory of Operation

FIG. 1A is a simplified diagram of a three-mode reconfigurable quadrature coupler 10 that is structured in accordance with the present disclosure. The reconfigurable quadrature coupler 10 includes an input port terminal 12 at a first port (PORT 1) and a coupled port transformer 14 connected to a second port (PORT 2). The coupled port transformer 14 is configured to have a selectable second port reflection coefficient $\Gamma_2$. The reconfigurable quadrature coupler 10 further includes an isolation port transformer 16 connected to a third port (PORT 3). The isolation port transformer 16 is configured to have a selectable third port reflection coefficient $\Gamma_3$. An isolation resistor RISO1 may be connected between PORT 3 and ground. A through port transformer 18 is connected to a fourth port (PORT 4). The through port transformer 18 is configured to have a selectable fourth port reflection coefficient $\Gamma_4$. In exemplary embodiments, such as depicted in FIG. 1A, the quadrature coupler 10 is of the Lange coupler type.

While referring to FIG. 1A, first consider that in a through mode of operation all port 1 input power is directed to port 4. For this to occur there can be no power dissipation in the coupled port transformer 14 connected to port 2 and the isolation port transformer 16 connected to port 3. Terminating impedances associated with port 2 and port 3 have to produce unity magnitude reflection coefficients such that all of the energy is reflected back into the coupler. The magnitude of a passive reflection coefficient at port 4 cannot be unity and needs to be determined.

$$\Gamma_2 = e^{j\phi_2} \Rightarrow a_2 = \Gamma_2 b_2$$

$$\Gamma_3 = e^{j\phi_3} \Rightarrow a_3 = \Gamma_3 b_3$$

$$\Gamma_4 = \frac{a_4}{b_4} = |\Gamma_4| e^{j\phi_4}$$

FIG. 1B depicts an ideal scattering matrix for a Lange coupler. Assuming that port 1 is driven ($\alpha_1 = 1$) and expanding the scattering matrix depicted in FIG. 1B produces four simultaneous equations:

$$b_1 = \Gamma_1 = \frac{1}{\sqrt{2}} a_2 + \frac{-j}{\sqrt{2}} a_4$$

$$b_2 = \frac{a_2}{\Gamma_2} = \frac{1}{\sqrt{2}} + \frac{-j}{\sqrt{2}} a_3$$

$$b_3 = \frac{a_3}{\Gamma_3} = \frac{-j}{\sqrt{2}} a_2 + \frac{1}{\sqrt{2}} a_4$$

$$b_4 = \frac{a_4}{\Gamma_4} = \frac{-j}{\sqrt{2}} + \frac{1}{\sqrt{2}} a_3$$

Figure 2A:
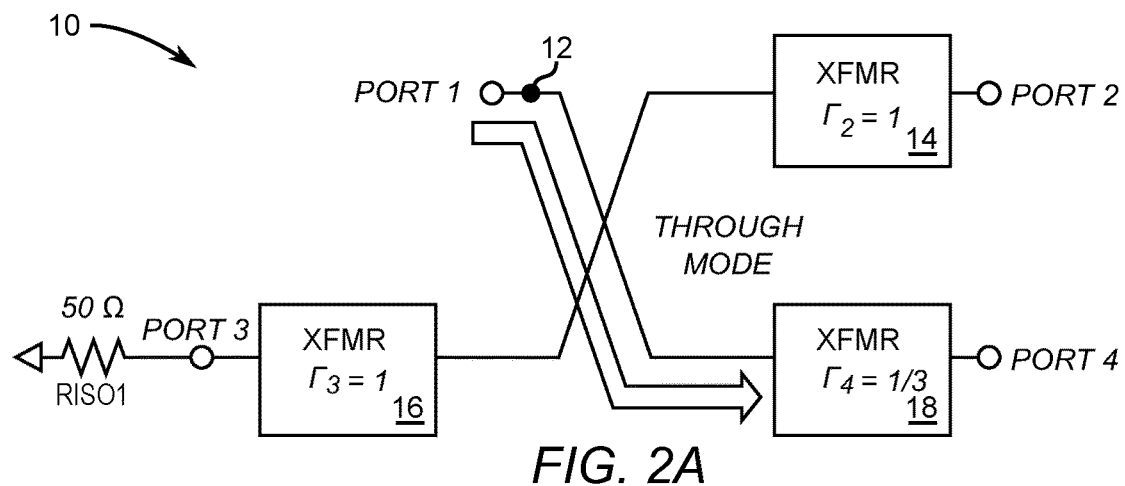
FIG. 2A depicts the reconfigurable quadrature coupler in the through mode with a through mode signal path indicated by a large arrow between the input terminal and port 4.

FIG. 2A depicts the reconfigurable quadrature coupler 10 in the through mode with a through mode signal path indicated by a large arrow between the input terminal 12 (port 1, also indicated at RF IN) and port 4. The magnitude of the through mode signal, port 1 to port 4, and the coupled mode signal, port 1 to port 2, is equal to the following:

$$|S_{41}| = \left|\frac{b_4}{a_1}\right| \sqrt{1 - |\Gamma_4|^2} = |b_4| \sqrt{1 - |\Gamma_4|^2}$$

$$|S_{21}| = \left|\frac{b_2}{a_1}\right| \sqrt{1 - |\Gamma_2|^2} = |b_4| \sqrt{1 - |\Gamma_2|^2}$$

Simultaneous solution of the scattering matrix equations results in the following for the through mode. $\Gamma_1$ is a reflection coefficient for port 1.

$$b_4 = \frac{-j}{\sqrt{2}} \left( \frac{1 - \Gamma_1\Gamma_3 + 2\Gamma_2\Gamma_3}{1 + \Gamma_2\Gamma_3} \right)$$

$$\Gamma_4 = \frac{a_4}{b_4} = \frac{\Gamma_2 - \Gamma_1\Gamma_2\Gamma_3 - 2\Gamma_1}{1 - \Gamma_1\Gamma_3 + 2\Gamma_2\Gamma_3}$$

Figure 2B:
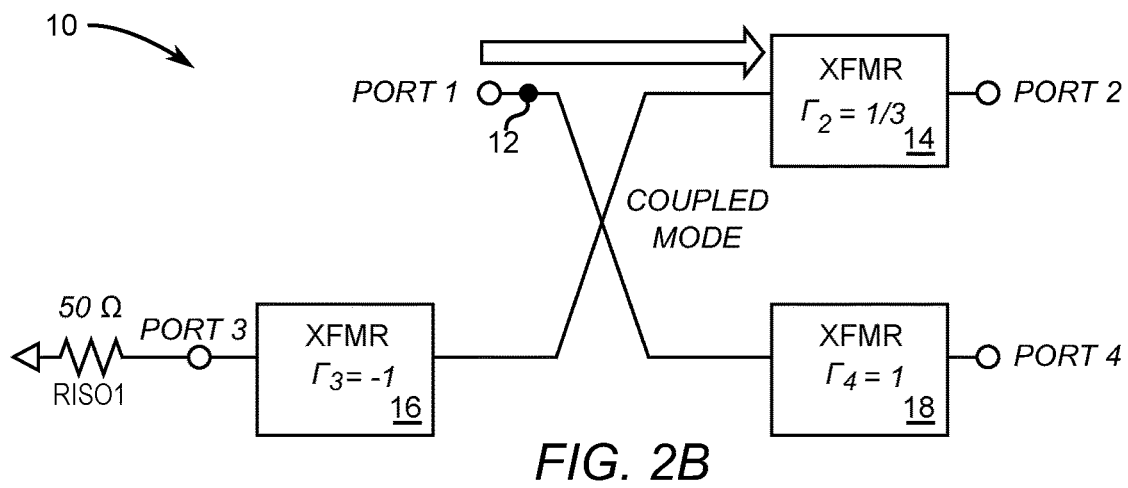
FIG. 2B depicts the reconfigurable quadrature coupler in the coupled mode with a coupled mode signal path indicated by a large arrow between the input terminal and port 2.

FIG. 2B depicts the reconfigurable quadrature coupler 10 in the coupled mode with a coupled mode signal path indicated by a large arrow between the input terminal 12 (port 1, also indicated at RF IN) and port 2. The coupled mode of operation is analyzed in a similar manner, producing $$b_2 = \frac{1}{\sqrt{2}} \left( \frac{1 + \Gamma_1\Gamma_3 - 2\Gamma_4\Gamma_3}{1 - \Gamma_4\Gamma_3} \right)$$

$$\Gamma_2 = \frac{a_2}{b_2} = \frac{\Gamma_4 + \Gamma_1\Gamma_4\Gamma_3 - 2\Gamma_1}{1 + \Gamma_1\Gamma_3 - 2\Gamma_4\Gamma_3}$$

For lossless power transfer from port 1 to port 2 and port 1 to port 4, port 1 must be matched such that $\Gamma_1=0$. A required value for the port 4 reflection coefficient $\Gamma_4$ set by reconfiguration of the through port transformer 18 for through mode operation and a required value for the port 2 reflection coefficient $\Gamma_2$ set by reconfiguration of the coupled port transformer 14 for coupled mode operation are given by the following, respectively, $$b_4 = \frac{-j}{\sqrt{2}}\left(\frac{1+2\Gamma_2\Gamma_3}{1+2\Gamma_2\Gamma_3}\right) \quad \Gamma_4 = \frac{a_4}{b_4} = \frac{\Gamma_2 - 2\Gamma_1}{1+2\Gamma_2\Gamma_3} \quad \text{(Through Mode)}$$

$$b_2 = \frac{1}{\sqrt{2}}\left(\frac{1-2\Gamma_4\Gamma_3}{1-\Gamma_4\Gamma_3}\right) \quad \Gamma_2 = \frac{a_2}{b_2} = \frac{\Gamma_4 - 2\Gamma_1}{1-2\Gamma_4\Gamma_3} \quad \text{(Coupled Mode)}$$

Note that $b_2$ and $b_4$ are of equal magnitude and quadrature phase under the following conditions:

$$\Gamma_{2,through}=\Gamma_{4,coupled} \; \Gamma_{2,through}\Gamma_{3,through}=-\Gamma_{3,coupled}\Gamma_{4,coupled}$$

Figure 2C:
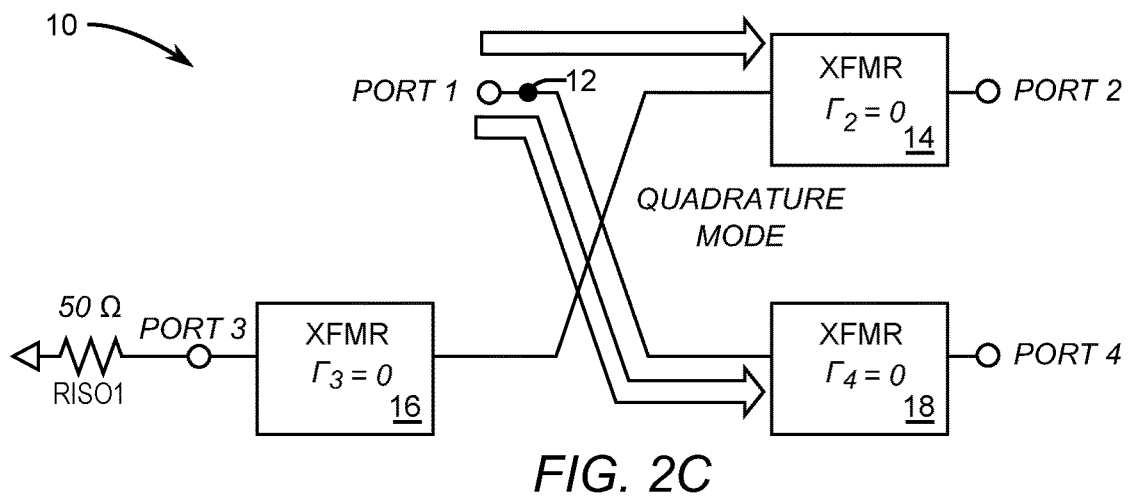
FIG. 2C depicts the reconfigurable quadrature coupler in quadrature mode with a first quadrature signal path indicated by a first large arrow between the input terminal and port 2 along with a second quadrature signal path indicated by a second large arrow between the input terminal and port 4.

FIG. 2C depicts the reconfigurable quadrature coupler 10 in quadrature mode with a first quadrature signal path indicated by a first large arrow between the input terminal 12 (port 1, also indicated at RF IN) and port 2, along with a second quadrature signal path indicated by a second large arrow between the input terminal 12 and port 4. The phase relationship between the through and coupled modes is the same as what occurs for normal quadrature operation with the through path being -90° phase shifted from the coupled path. This is a key property for this circuit as the couplers can be reconfigured in a balanced amplifier architecture without altering the natural phase relationships. The angles for $\Gamma_2$, $\Gamma_3$, and $\Gamma_4$ that produce a $\Gamma_1=0$ condition are calculated as follows. It can be shown that the port 1 reflection coefficient $\Gamma_1$ is equal to $$\Gamma_1 = \frac{\Gamma_2 - \Gamma_4 - 2\Gamma_2\Gamma_3\Gamma_4}{2 + \Gamma_3\Gamma_2 - \Gamma_4\Gamma_3}$$

Setting this equal to zero is substituting the through mode reflection coefficients, $$e^{j\phi_2} - |\Gamma_4|e^{j\phi_4} - 2|\Gamma_4|e^{j(\phi_2+\phi_3+\phi_4)} = 0$$

This equation has many different solutions, and one tractable solution is to assume all three angles are equal. Thus, $$\Gamma_2=\Gamma_3=e^{j\phi}\Gamma_4=|\Gamma_4|e^{j\phi}$$

Substituting into the $\Gamma_1=0$ equation reduces to the following. Since $\Gamma_4$ is assumed to be passive, it follows that $|\Gamma_4|<1$ and $e^{j2\phi}$ must be a positive real number.

$$\frac{1-|\Gamma_4|}{2|\Gamma_4|} = e^{j2\phi}$$

This means that $\phi$ is equal to $N\pi$, where $N=0, 1, 2, \ldots$ such that $e^{j2\phi}=1$. Solving the above, $|\Gamma_4|=1/3$. Another solution that produces the same result for $|\Gamma_4|$ is to assume that all angles are equal but shifted by 180°:

$$\Gamma_2=\Gamma_3=e^{j\pi}e^{j\phi}\Gamma_4=|\Gamma_4|e^{j\pi}e^{j\phi}$$

Coupled mode reflection coefficients have a similar form.

$$\Gamma_4 = e^{j\phi_4} \Rightarrow a_4 = \Gamma_4 b_4$$

$$\Gamma_3 = e^{j\phi_3} \Rightarrow a_3 = \Gamma_3 b_3$$

$$\Gamma_2 = \frac{a_2}{b_2} = |\Gamma_2|e^{j\phi_2}$$

For a matched port 1, the following equation must be satisfied for the coupled mode:

$$|\Gamma_2|e^{j\phi_2} - e^{j\phi_4} - 2|\Gamma_2|e^{j(\phi_2+\phi_3+\phi_4)} = 0$$

If all angles are assumed to be equal, the foregoing equation reduces to the following, a negative real number:

$$\frac{|\Gamma_2|-1}{2|\Gamma_2|} = e^{j2\phi}$$

This means that $\phi$ is equal to $\pi(2N+1)/2$, where $N=0, 1, 2, \ldots$ such that $e^{j2\phi}=-1$. Solving the above produces the same result as the through mode case, $|\Gamma_2|=1/3$. Another solution that produces the same $|\Gamma_2|$ is to assume that $\phi_3$ is 180° out of phase from $\phi_4$, $$\Gamma_4=-\Gamma_3=e^{j\phi} \; \Gamma_2=|\Gamma_2|e^{j\phi}$$

Substituting and rearranging the matched port 1 equation reduces to what is shown below. This is the same as the equal angle case for the through mode. Solutions are $|\Gamma_2|=1/3$ and $\phi=N\pi$, where $N=0, 1, 2, \ldots$.

$$\frac{1-|\Gamma_2|}{2|\Gamma_2|} = e^{j2\phi}$$

Therefore one set of many possible reconfigurable coupler designs are shown in FIG. 2.

Three-Mode Reconfigurable Coupler Design

Figure 3:
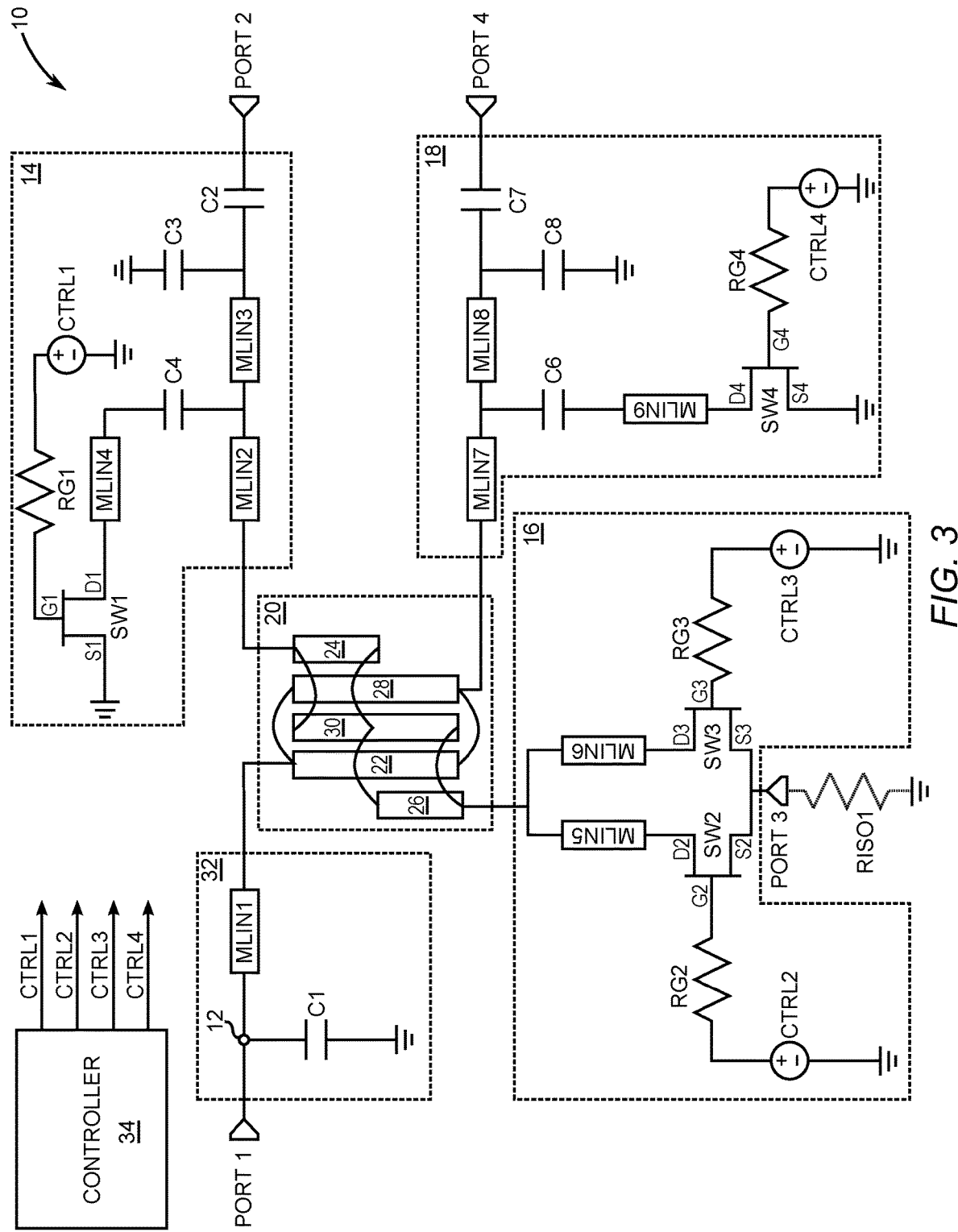
FIG. 3 is a detailed schematic of an exemplary embodiment of the reconfigurable quadrature coupler in accordance with the present disclosure.

FIG. 3 is a detailed schematic of an exemplary embodiment of the reconfigurable quadrature coupler 10. This exemplary embodiment includes a Lange coupler structure 20 that has an input port transmission line 22 connected to the first port (PORT 1), and a coupled port transmission line 24 with the coupled port transformer 14 connected between the coupled port transmission line 24 and the second port (PORT 2). The Lange coupler structure 20 also includes an isolation port transmission line 26 with the isolation port transformer 16 connected between the isolation port transmission line 26 and the third port (PORT 3). The Lange coupler structure 20 further includes a through port transmission line 28 with the through port transformer 18 connected between the through port transmission line 28 and the fourth port (PORT 4). The Lange coupler structure 20 further includes a central transmission line 30 that is connected to the coupled port transmission line 24 and the isolation port transmission line 26.

In this exemplary embodiment, an input matching network 32 is connected to PORT 1. The input matching network 32 has a first microstrip line MLIN1 coupled between input port terminal 12 and the input port transmission line 22 and a first capacitor C1 coupled between the input port terminal 12 and ground.

Also, as depicted in FIG. 3, an exemplary embodiment of the coupled port transformer 14 includes a second microstrip line MLIN2, a third microstrip line MLIN3, and a second capacitor C2 that are connected in series between the coupled port transmission line 24 and PORT 2. A third capacitor C3 is coupled between ground and a node between the third microstrip line MLIN3 and PORT2.

To make the value of the reflection coefficient $\Gamma_2$ for PORT 2 selectable, the coupled port transformer 14 is made reconfigurable by way of a first switched impedance branch that is connected to ground through a first transistor switch SW1. The first switched impedance branch has a fourth capacitor C4 and a fourth microstrip MLIN4 connected in series between a drain D1 of the first transistor switch SW1 and a node between the second microstrip line MLIN2 and the third microstrip line MLIN3. A source S1 of the first transistor switch SW1 is coupled to ground, and a gate G1 of the first switch SW1 is coupled to ground through a first gate resistor RG1. A first control line CTRL1 is connected between a controller 34 and the gate G1 of the first transistor switch SW1. When the controller 34 turns on the first transistor switch SW1, the first switched branch is active and the value of the reflection coefficient $\Gamma_2$ is different from when the controller 34 turns off the first transistor switch SW1.

Moreover, as depicted in FIG. 3, an exemplary embodiment of the isolation port transformer 16 includes a fifth microstrip line MLIN5 connected between the isolation port transmission line 26 and PORT 3 through a second transistor switch SW2. A drain D2 of the second transistor switch SW2 is connected to the fifth microstrip line MLIN5, and a source S2 is coupled to PORT 3. A gate G2 of the second transistor switch SW2 is connected to ground through a second gate transistor RG2. A second control line CTRL2 is coupled between the controller 34 and the gate G2 of the second transistor switch SW2. PORT 3 may be coupled to ground through the optional isolation resistor RISO1, or PORT 3 may be coupled directed to ground. When the controller 34 turns on the second switch SW2, the fifth microstrip line MLIN5 is active and the value of the reflection coefficient $\Gamma_3$ is different from when the controller 34 turns off the second transistor switch SW2.

Further, as depicted in FIG. 3, the exemplary embodiment of the isolation port transformer 16 includes a sixth microstrip line MLIN6 connected between the isolation port transmission line 26 and PORT 3 through a third transistor switch SW3. A drain D3 of the third transistor switch SW3 is coupled to the sixth microstrip line MLIN6, and a source S3 is coupled to PORT 3. A gate G3 of the third transistor switch SW3 is connected to ground through a third gate transistor RG3. A third control line CTRL3 is coupled between the controller 34 and the gate G3 of the third transistor switch SW3. As stated previously, PORT 3 may be coupled to ground through the optional isolation resistor RISO1, or PORT 3 may be coupled directed to ground. When the controller 34 turns on the third switch SW3, the sixth microstrip line MLIN6 is active and the value of the reflection coefficient $\Gamma_3$ is different from when the controller 34 turns off the third transistor switch SW3. Moreover, the value of the reflection coefficient $\Gamma_3$ is different from when the controller 34 turns off both the second transistor switch SW2 and the third transistor switch SW3 than when the controller turns on both the second transistor switch SW2 and the third transistor switch SW3.

Further still, as depicted in FIG. 3, an exemplary embodiment of the through port transformer 18 includes a seventh microstrip line MLIN7, an eighth microstrip line MLIN8, and a seventh capacitor C7 that are connected in series between the through port transmission line 28 and PORT 4. An eighth capacitor C8 is coupled between ground and a node between the seventh microstrip line MLIN7 and the seventh capacitor C7.

In order to make the value of the reflection coefficient $\Gamma_4$ for PORT 4 selectable, the through port transformer 18 is made reconfigurable by way of a fourth switched impedance branch that is connected to ground through a fourth transistor switch SW4. The fourth switched impedance branch has a sixth capacitor C6 and a ninth microstrip MLIN9 connected in series between a drain D4 of the fourth transistor switch SW4 and a node between the seventh microstrip line MLIN7 and the eighth microstrip line MLIN8. A source S4 of the fourth transistor switch SW4 is coupled to ground, and a gate G4 of the fourth transistor SW4 is coupled to ground through a fourth gate resistor RG4. A fourth control line CTRL4 is connected between the controller 34 and the gate G4 of the fourth switch SW4. When the controller 34 turns on the fourth switch SW4, the fourth switched branch is active and the value of the reflection coefficient $\Gamma_4$ is different from when the controller 34 turns off the fourth transistor switch SW4.

All of the circuit elements such as microstrip lines MLIN1 through MLIN9 and capacitors C1 through C8 may or may not be required depending on application, frequency, bandwidth, and actual terminating impedances. Switched transmission lines such as the microstrip lines MLIN5 and MLIN6 may be of two different lengths and may be connected to PORT 3 to realize $\Gamma_3$ reflection coefficients 180° out of phase. To further investigate, reconfigurable impedance transforming circuits were designed using the topology shown in FIG. 3 as the starting point. The investigated versions of the reconfigurable quadrature coupler 10 depicted in FIG. 3 were optimized over a frequency range consistent with satellite downlink applications, 19 GHz to 23 GHz.

Figure 4:
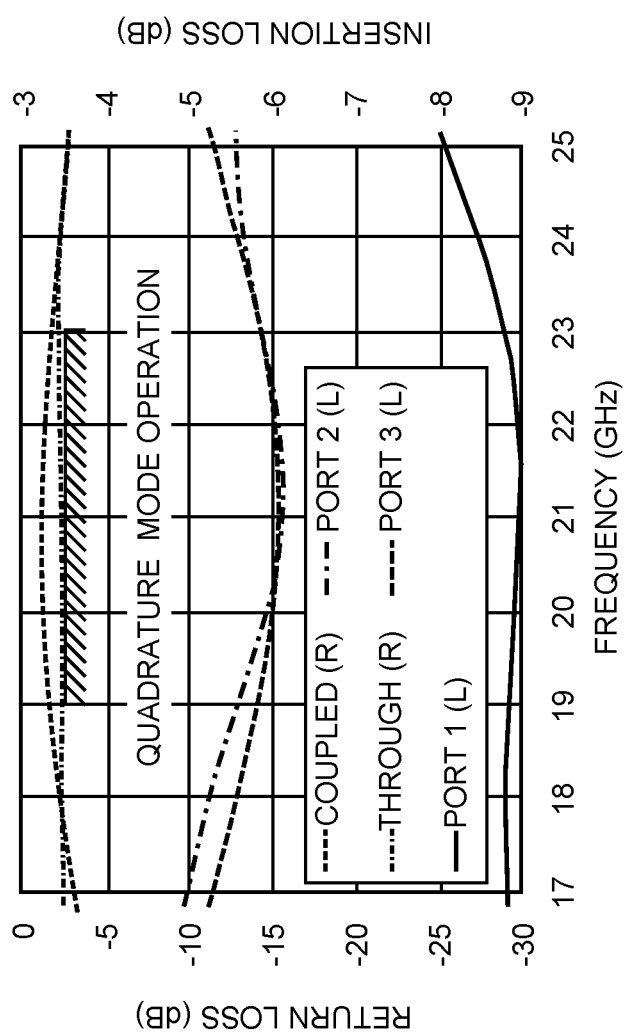
FIG. 4 is a graph depicting return loss and insertion loss of quadrature mode operation of the embodiment of the reconfigurable quadrature coupler depicted in FIG. 3.
Figure 5:
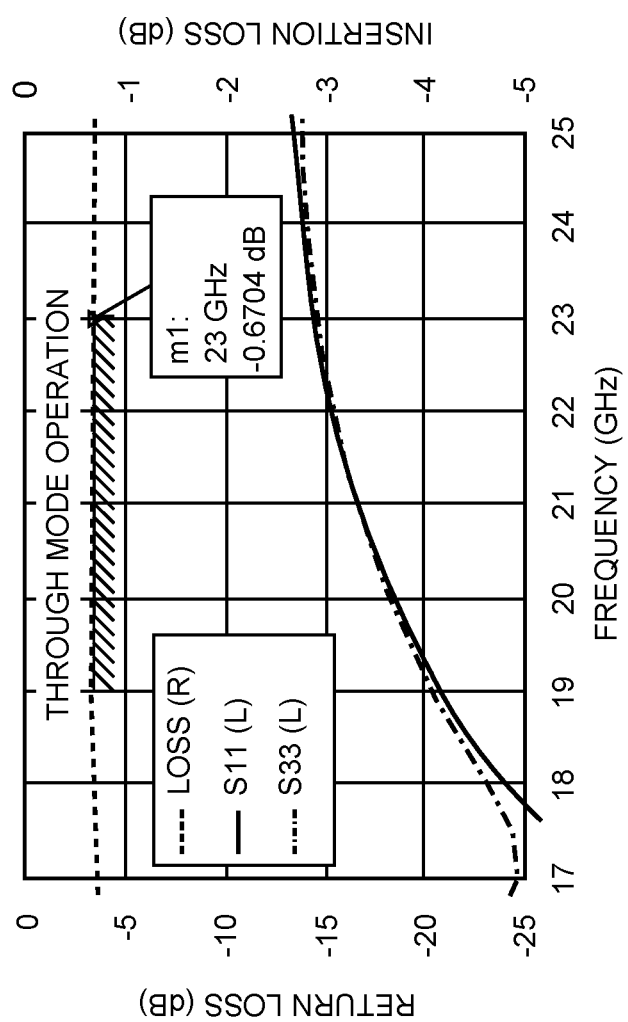
FIG. 5 is a graph depicting return loss and insertion loss of through mode operation of the embodiment of the reconfigurable quadrature coupler depicted in FIG. 3.
Figure 6:
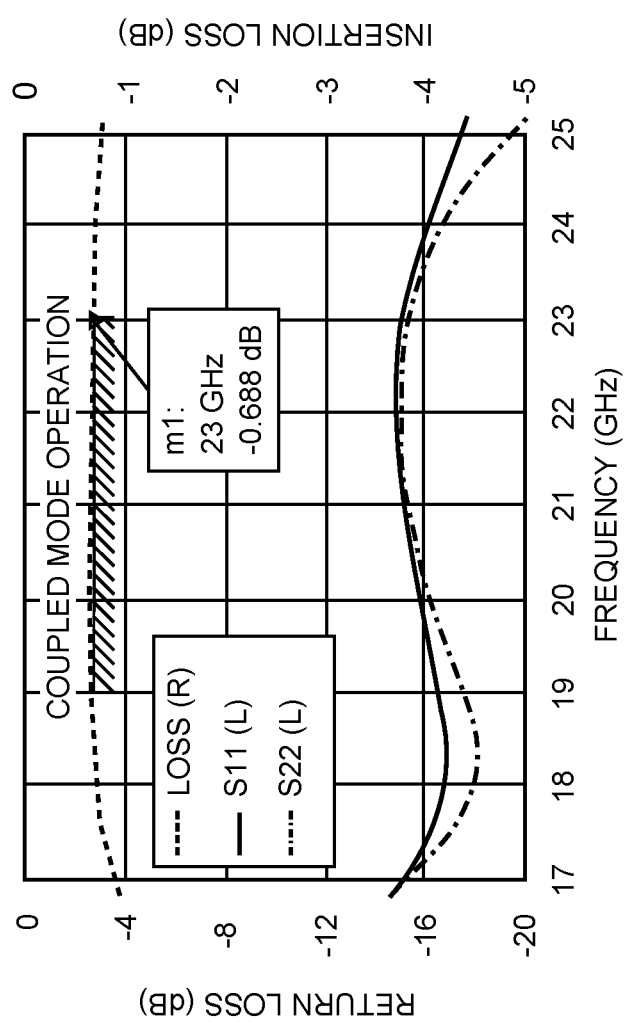
FIG. 6 is a graph depicting return loss and insertion loss of coupled mode operation of the embodiment of the reconfigurable quadrature coupler depicted in FIG. 3.
Figure 7:
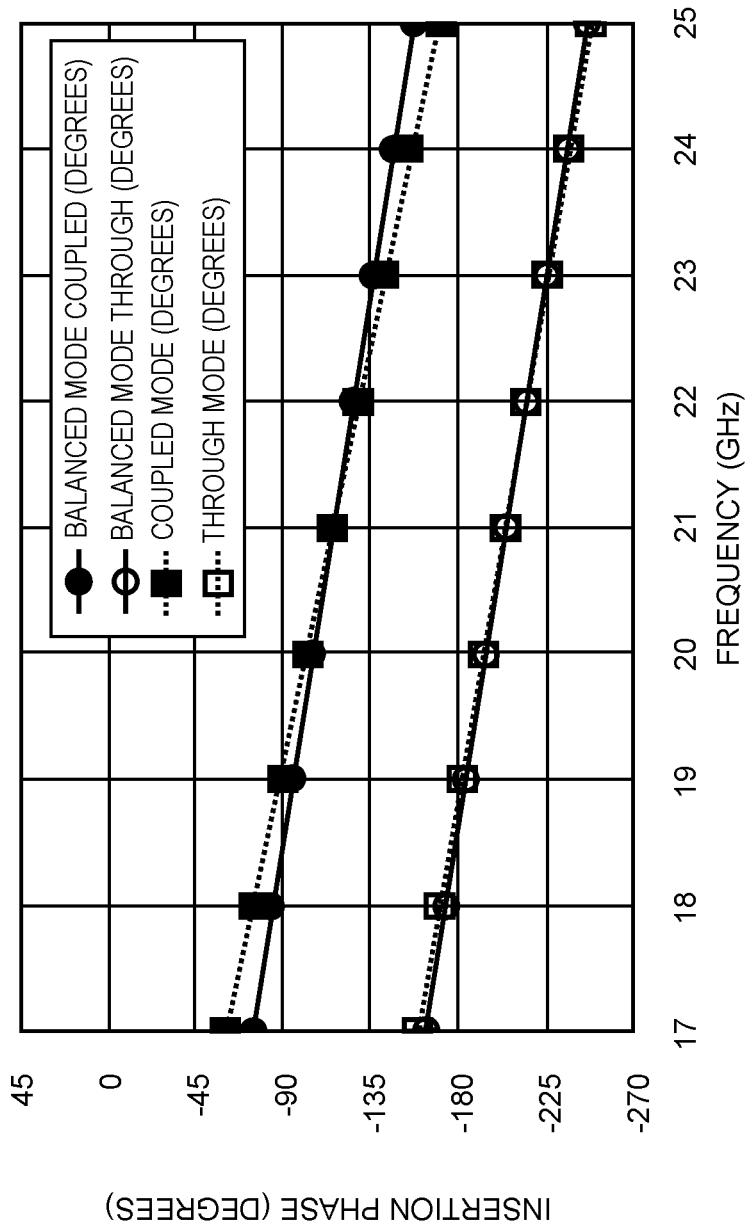
FIG. 7 is a graph depicting insertion phase versus frequency for coupled mode operation and balanced mode operation of the embodiment of the reconfigurable quadrature coupler depicted in FIG. 3.

Simulated results are plotted in FIGS. 4-7. FIG. 4 is a graph depicting return loss and insertion loss of quadrature mode operation of the embodiment of the reconfigurable quadrature coupler depicted in FIG. 3. FIG. 5 is a graph depicting return loss and insertion loss of through mode operation of the embodiment of the reconfigurable quadrature coupler depicted in FIG. 3. FIG. 6 is a graph depicting return loss and insertion loss of coupled mode operation of the embodiment of the reconfigurable quadrature coupler depicted in FIG. 3. FIG. 7 is a graph depicting insertion phase versus frequency for coupled mode operation and balanced mode operation of the embodiment of the reconfigurable quadrature coupler depicted in FIG. 3.

For both coupled mode and through mode of operation, the insertion loss is less than 0.7 dB over a 4 GHz bandwidth centered at 21 GHz. For the quadrature mode of operation, the insertion loss is estimated to be less than 0.4 dB. The phase error from quadrature for the through and coupled modes referenced to the corresponding balanced mode is typically less than 6°. This amount of phase error results in a near negligible 0.025 dB of combining loss when used in balanced architectures without disrupting quadrature operation.

Note that these simulations are for a single coupler design capable of operating in all three modes. For most applications, the reconfigurable quadrature coupler 10 only has to operate in two of the three modes. For example, in a balanced amplifier application one embodiment of the reconfigurable quadrature coupler 10 operates in the quadrature/through mode and while another embodiment of the reconfigurable quadrature coupler 10 operates in the quadrature/coupled mode. When used as a single-pole double-throw switch or a 90° phase shift circuit, the reconfigurable quadrature coupler 10 is required to operate in through mode or coupled mode only. When only two modes are required, the reconfigurable coupler 10 can be optimized to have better performance than what is shown in FIGS. 4 and 6. In the balanced amplifier application, multiple reconfigurable quadrature couplers 10 can have different circuit element values if the quadrature phase relationship shown in FIG. 7 is maintained.

Those skilled in the art will recognize improvements and modifications to the preferred embodiments of the present disclosure. For example, while the proceeding analysis and design was associated with a Lange-type quadrature coupler, the disclosed approach works equally well for other coupler types, for example, "Rat Race" couplers and others, but these have ideal scattering matrices that are different from the Lange coupler. Thus, it is to be understood that the disclosed design analysis will work for any 3 dB coupler with a 90 degree phase shift between output ports. All such improvements and modifications are considered within the scope of the concepts disclosed herein and the claims that follow.

What is claimed is:

1. A reconfigurable quadrature coupler comprising:
an input port transmission line connected to a first port;
a coupled port transmission line;
a coupled port transformer connected between the coupled port transmission line and a second port, wherein the coupled port transformer is configured to have a selectable second port reflection coefficient;
an isolation port transmission line;
an isolation port transformer connected between the isolation transmission line and a third port, wherein the isolation port transformer is configured to have a selectable third port reflection coefficient.
a through port transmission line; and
a through port transformer connected between the through port transmission line and a fourth port, wherein the through port transformer is configured to have a selectable fourth port reflection coefficient.

2. The reconfigurable quadrature coupler of claim 1 wherein the coupled port transmission line, the isolation port transmission line, and the through port transmission line comprise a Lange coupler structure.

3. The reconfigurable quadrature coupler of claim 1 wherein a quadrature mode is activated when the selectable second port reflection coefficient, the selectable third port reflection coefficient, and the selectable fourth port reflection coefficient are all substantially equal to zero.

4. The reconfigurable quadrature coupler of claim 3 wherein insertion loss of the reconfigurable quadrature coupler is less than 0.4 dB for the quadrature mode of operation.

5. The reconfigurable quadrature coupler of claim 1 wherein a through mode is activated when the selectable second port reflection coefficient and the selectable third port reflection coefficient are substantially equal to 1, while the selectable fourth port reflection coefficient is substantially equal to one-third.

6. The reconfigurable quadrature coupler of claim 5 wherein insertion loss is less than 0.7 dB over a 4 GHz bandwidth centered at 21 GHz for the through mode of operation.

7. The reconfigurable quadrature coupler of claim 5 wherein a phase error for the through mode referenced to a corresponding balanced mode is less than 6°.

8. The reconfigurable quadrature coupler of claim 1 wherein a coupled mode is activated when the selectable second port reflection coefficient is substantially equal to one-third and the selectable third port reflection coefficient is substantially equal to -1, while the selectable fourth port reflection coefficient is substantially equal to 1.

9. The reconfigurable quadrature coupler of claim 8 wherein insertion loss is less than 0.7 dB over a 4 GHz bandwidth centered at 21 GHz for the coupled mode of operation.

10. The reconfigurable quadrature coupler of claim 8 wherein a phase error for the coupled mode referenced to a corresponding balanced mode is less than 6°.

11. The reconfigurable quadrature coupler of claim 1 wherein the coupled port transformer includes at least one switchable impedance branch that is selectively activated by at least one transistor switch.

12. The reconfigurable quadrature coupler of claim 1 wherein the isolation port transformer includes at least one switchable impedance branch that is selectively activated by at least one transistor switch.

13. The reconfigurable quadrature coupler of claim 1 wherein the through port transformer includes at least one switchable impedance branch that is selectively activated by at least one transistor switch.

14. The reconfigurable quadrature coupler of claim 1 wherein each of the coupled port transformer, the isolation port transformer, and the through port transformer includes at least one switchable impedance branch that is selectively activated by at least one transistor switch.

15. The reconfigurable quadrature coupler of claim 14 wherein the at least one transistor switch is selectably switched on and off by a controller.

16. The reconfigurable quadrature coupler of claim 1 wherein the isolation port transformer includes a first switchable impedance branch that is selectively activated by a first transistor switch and a second switchable impedance branch that is selectively activated by a second transistor switch.

17. The reconfigurable quadrature coupler of claim 16 wherein the first switchable impedance branch comprises a first microstrip line and the second switchable impedance branch comprises a second microstrip line that has a length that is substantially different from a length of the first microstrip line.

18. The reconfigurable quadrature coupler of claim 17 wherein the substantially different lengths of the first switchable impedance branch and the second switchable impedance branch realize third port reflection coefficients that are substantially 180° out of phase.

19. The reconfigurable quadrature coupler of claim 1 wherein the second port reflection coefficient $\Gamma_2$, for a coupled mode satisfies $$|\Gamma_2|e^{j\phi_2}-e^{j\phi_4}-2|\Gamma_2|e^{j(\phi_2+\phi_3+\phi_4)}=0.$$

20. The reconfigurable quadrature coupler of claim 1 wherein the fourth port reflection coefficient $\Gamma_2$ for a through mode satisfies $$e^{j\phi_2}-|\Gamma_4|e^{j\phi_4}-2|\Gamma_4|e^{j(\phi_2+\phi_3+\phi_4)}=0.$$

* * * * *